United States Patent
Jin et al.

(10) Patent No.: US 9,929,302 B2
(45) Date of Patent: Mar. 27, 2018

(54) METHOD FOR MAKING SOLAR CELLS

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 114 days.

(21) Appl. No.: 15/099,521

(22) Filed: Apr. 14, 2016

(65) Prior Publication Data
US 2016/0225936 A1 Aug. 4, 2016

Related U.S. Application Data

(63) Continuation of application No. 13/727,999, filed on Dec. 27, 2012.

(30) Foreign Application Priority Data

Mar. 30, 2012 (CN) .......................... 2012 1 0089074

(51) Int. Cl.
| | | |
|---|---|---|
| *H01L 31/18* | (2006.01) | |
| *H01L 31/0352* | (2006.01) | |
| *H01L 31/0224* | (2006.01) | |
| *H01L 31/0236* | (2006.01) | |
| *H01L 31/068* | (2012.01) | |

(52) U.S. Cl.
CPC ........ *H01L 31/18* (2013.01); *H01L 31/02363* (2013.01); *H01L 31/022425* (2013.01); *H01L 31/035209* (2013.01); *H01L 31/068* (2013.01); *Y02E 10/547* (2013.01)

(58) Field of Classification Search
CPC ............... H01L 31/18; H01L 31/02363; H01L 31/022425; H01L 31/068; H01L 31/035209; Y02E 10/547
See application file for complete search history.

(56) References Cited

U.S. PATENT DOCUMENTS 6,495,862 B1* 12/2002 Okazaki .................. H01L 33/20
257/103
2012/0152353 A1* 6/2012 Zhu .................... H01L 31/03529
136/261

* cited by examiner

*Primary Examiner* — Selim Ahmed
(74) *Attorney, Agent, or Firm* — ScienBiziP, P.C.

(57) ABSTRACT

A solar cell is provided. The solar cell includes a silicon substrate, a back electrode, a doped silicon layer, and an upper electrode. The silicon substrate includes a first surface, a second surface, and a number of three-dimensional nano-structures located on the first surface. The three-dimensional nano-structures are located on the second surface. The three-dimensional nano-structures are linear protruding structures that are spaced from each other, and a cross section of each linear protruding structure is an arc. The doped silicon layer is attached to the three-dimensional nano-structures and the second surface between the three-dimensional nano-structures.

20 Claims, 8 Drawing Sheets

METHOD FOR MAKING SOLAR CELLS

CROSS-REFERENCE TO RELATED APPLICATIONS

This application is a continuation application of U.S. patent application Ser. No. 13/727,999, filed Dec. 27, 2012, entitled, "SOLAR CELLS", which claims all benefits accruing under 35 U.S.C. § 119 from China Patent Application No. 201210089074.8, filed on Mar. 30, 2012 in the China Intellectual Property Office, the disclosure of which is incorporated herein by reference. This application is related to applications entitled, "METHOD FOR MAKING SOLAR CELLS", filed on Dec. 27, 2012, with application Ser. No. 13/727,988, "WHITE LIGHT EMITTING DIODES", filed on Dec. 27, 2012, with application Ser. No. 13/728,006, "METHOD FOR MAKING LIGHT EMITTING DIODES", filed on Dec. 27, 2012, with application Ser. No. 13/728,018, "LIGHT EMITTING DIODES", filed on Dec. 27, 2012, with application Ser. No. 13/728,031, "LIGHT EMITTING DIODES", filed on Dec. 27, 2012, with application Ser. No. 13/728,035, "METHOD FOR MAKING LIGHT EMITTING DIODES", filed on Dec. 27, 2012, with application Ser. No. 13/728,043, "LIGHT EMITTING DIODES", filed on Dec. 27, 2012, with application Ser. No. 13/728,054, "LIGHT EMITTING DIODES AND OPTICAL ELEMENTS", filed on Dec. 27, 2012, with application Ser. No. 13/728,063, and "METHOD FOR MAKING LIGHT EMITTING DIODES AND OPTICAL ELEMENTS", filed on Dec. 27, 2012, with application Ser. No. 13/728,076.

FIELD

The present disclosure relates to a method for making solar cells.

BACKGROUND

Solar cells can convert light energy into electrical energy. Solar cells work via photovoltaic effects of the semiconductor materials. Solar cells can be silicon solar cells, gallium arsenide solar cells, or organic thin film solar cells. Among the solar cells, silicon solar cells are most widely fabricated because of their excellent efficiency in energy conversion and low production cost.

A silicon solar cell generally includes a back electrode, a silicon substrate, a doped silicon layer and an upper electrode disposed in that sequence. The doped silicon layer is used as a photovoltaic conversion material, and has a smooth surface for extracting sunlight. The silicon substrate and the doped silicon layer can form a number of P-N junctions, the P-N junctions can produce a number of electron-hole pairs under excitation of the sunlight. However, the area of the smooth surface for extracting sunlight is small, thus an extraction light surface of the solar cell has a small area. Furthermore, when the sunlight irradiates the smooth surface, a part of the sunlight is absorbed by the doped silicon layer, and the other part of the sunlight reflected back by the smooth surface cannot be reused. Therefore, the utilization efficiency of the solar cell is relatively low.

What is needed, therefore, is to provide a method for making a solar cell, and the solar cell with a relatively large extraction light surface.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
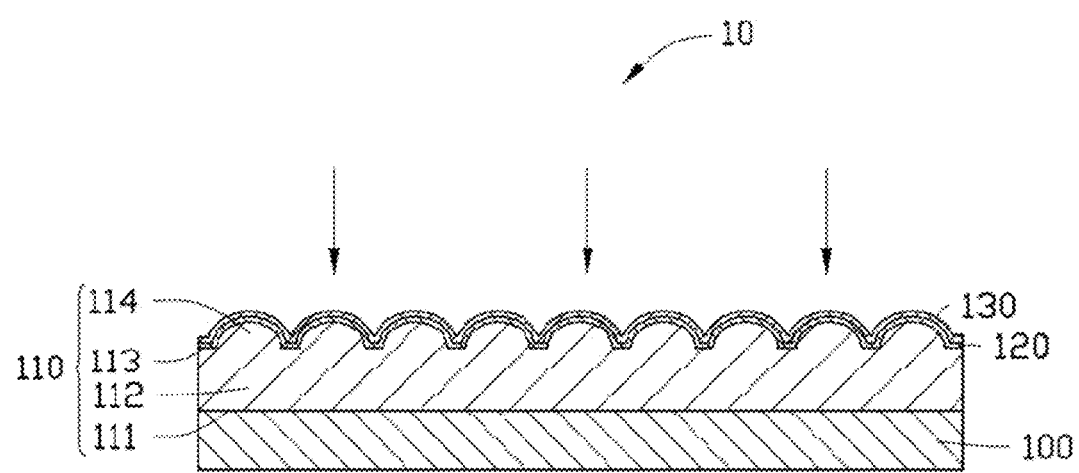
FIG. 1 is a schematic view of one embodiment of a solar cell.

Referring to FIG. 1, one embodiment of a solar cell 10 is provided. The solar cell 10 includes a back electrode 100, a silicon substrate 110, a doped silicon layer 120, and an upper electrode 130. The silicon substrate 110, the doped silicon layer 120, and the upper electrode 130 are stacked in that order and are located on a surface of the back electrode 100. The upper electrode 130 includes a surface for receiving sunlight.

The silicon substrate 110 includes a body 112 and a number of three-dimensional nano-structures 114. The body 112 includes a first body surface 111 and a second body surface 113. The three-dimensional nano-structures 114 are located on the second body surface 113. The first body surface 111 of the silicon substrate 110 is electrically connected to the back electrode 100. The second body surface 113 is located adjacent to the upper electrode 130. The doped silicon layer 120 is located on outer surfaces of the three-dimensional nano-structures 114 and the second body surface 113 that is between adjacent three-dimensional nano-structures 114. The upper electrode 130 covers at least part of surface of the doped silicon layer 120.

The back electrode 100 can be made of silver, aluminum, magnesium or other metals. A thickness of the back electrode 100 ranges from about 10 micrometers to about 300 micrometers. In one embodiment, the back electrode 100 is an aluminum foil with a thickness of about 200 micrometers.

Figure 2:
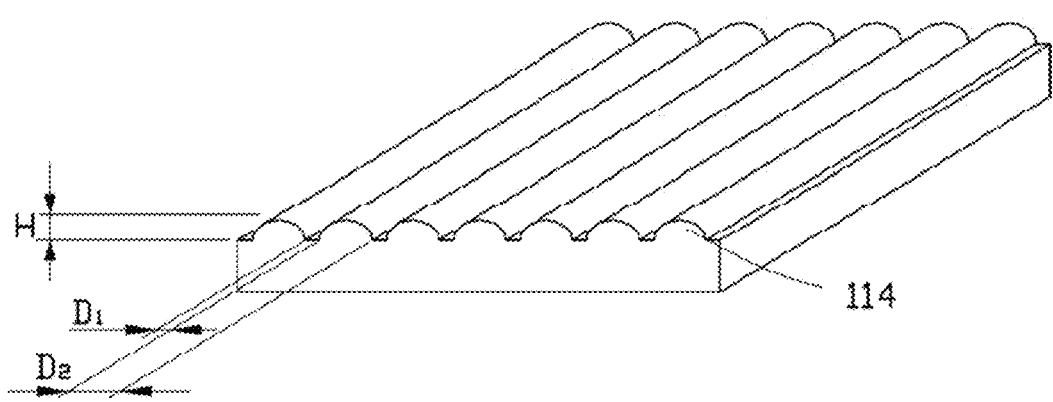
FIG. 2 is a schematic view of a silicon substrate shown in FIG. 1.
Figure 3:
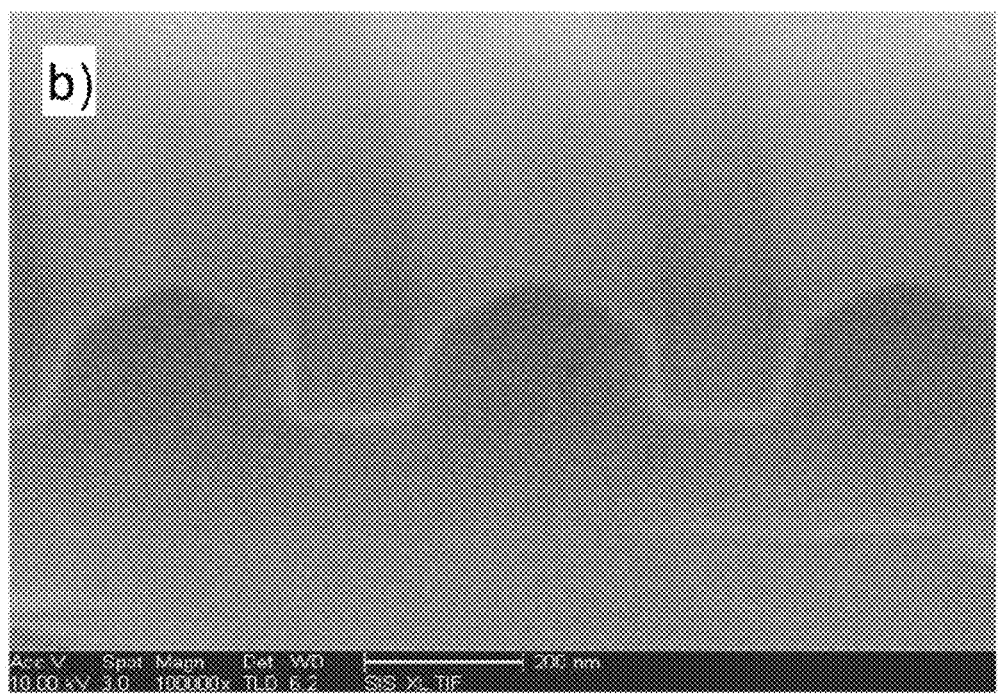
FIG. 3 shows a Scanning Electron Microscope (SEM) image of the silicon substrate shown in FIG. 2.

Referring to FIG. 2 and FIG. 3, the silicon substrate 110 can be a P-type silicon substrate. A material of the silicon substrate 110 can be single crystal silicon, multiple crystal silicon, or other P-type semiconductor materials. In one embodiment, the material of the silicon substrate 110 is single crystal silicon. A thickness of the silicon substrate 110 ranges from about 200 micrometers to about 300 micrometers.

Figure 4:
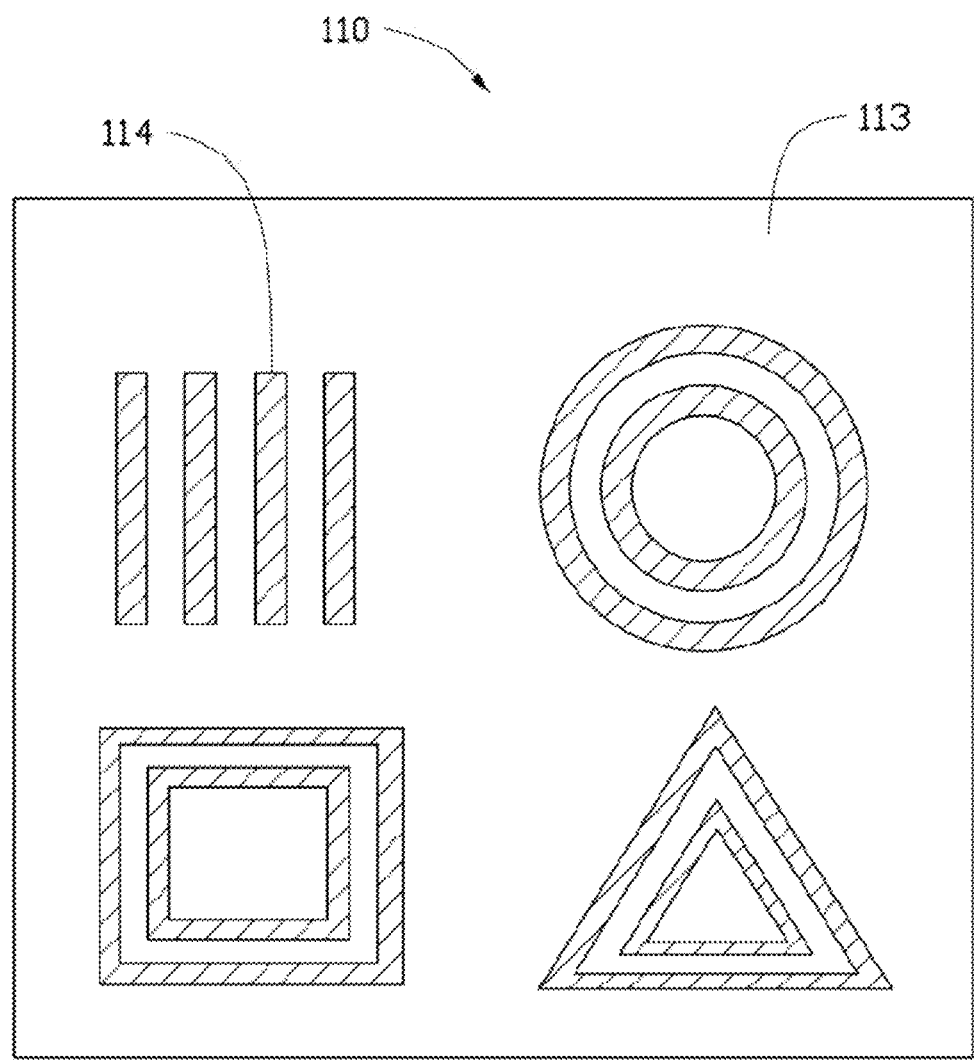
FIG. 4 is a schematic view of a number of three-dimensional nano-structures distributed on second surface of silicon substrate to form different arrays.

The three-dimensional nano-structures 114 can be linear protruding structures. The linear protruding structures can protrude out of the second body surface 113 to form an integrated structure. The linear protruding structures can be uniformly distributed on the second body surface 113 and spaced from each other. The linear protruding structures can be uniformly distributed on the second body surface 113 to form an array. Referring to FIG. 4, the linear protruding structures in the array can be substantially equidistantly arranged, concentric circularly arranged, or concentric rectangle arranged. In one embodiment, the linear protruding structures are substantially equidistantly arranged. The linear protruding structures can arrange along a straight line, a curvy line, or a polygonal line. The adjacent linear protruding structures can be arranged with a certain distance $D_1$. $D_1$ can range from about 10 nanometers to about 1000 nanometers. In some embodiments, $D_1$ ranges from about 100 nanometers to about 200 nanometers. In one embodiment, $D_1$ is about 140 nanometers. The linear protruding structures can extend along a same direction. A cross-section of the linear protruding structures along the extending direction can be an arc. A height H of the arc can range from about 100 nanometers to about 500 nanometers. In some embodiments, H ranges from about 150 nanometers to about 200 nanometers. A width $D_2$ of the arc can range from about 200 nanometers to about 1000 nanometers. In some embodiments, $D_2$ ranges from about 300 nanometers to about 400 nanometers. In some embodiments, the cross-section of the linear protruding structure along the extending direction is a semicircle. A diameter of the semicircle can range from about 300 nanometers to about 400. In one embodiment, the diameter of the semicircle is about 300 nanometers.

The doped silicon layer 120 can be located on an outer surface of the three-dimensional nano-structures 114 and the second body surface 113 that is between adjacent three-dimensional nano-structures 114. The doped silicon layer 120 can be an N-type doped silicon layer. A thickness of the N-type doped silicon layer can range from about 10 nanometers to about 1 micrometer. The doped silicon layer 120 can be formed by injecting superfluous N-type doped material, such as phosphorus or arsenic, into the outer top surface of the three-dimensional nano-structures 114 and the second body surface 113 that is between adjacent three-dimensional nano-structures 114. An interface between the doped silicon layer 120 and the silicon substrate 110 forms a plurality of P-N junctions that can be used to convert solar energy to electrical energy. The three-dimensional nano-structures 114 can have the property of photonic crystal. The three-dimensional nano-structures 114 are located on the second body surface 113 of the body 112, which makes the solar cell 10 having a larger area for absorbing sunlight. Therefore, the solar cell 10 can increase the photons residence time in the interface and broaden the frequency range of light absorbed by the three-dimensional nano-structures 114, thus improving the light absorbing efficiency and the photoelectric conversion efficiency of the solar cell 10.

If the sunlight irradiate on the three-dimensional nano-structure 114, a part of the sunlight can be absorbed by the three-dimensional nano-structure 114, and another part of the sunlight can be reflected by the three-dimensional nano-structure 114. The sunlight reflected by the three-dimensional nano-structure 114 can irradiate on the adjacent three-dimensional nano-structures 114, and a part of the reflected sunlight can be absorbed by the adjacent three-dimensional nano-structures 114. Therefore, the sunlight irradiating on the three-dimensional nano-structures 114 can be reflected and absorbed many times by the three-dimensional nano-structures 114. Thus, the light utilization efficiency of the solar cell 10 can be further improved.

The upper electrode 130 can be used to collect current produced by the photoelectric conversion in the P-N junctions. The upper electrode 130 can partially contact with the doped silicon layer 120 or completely contact with the doped silicon layer 120. In one embodiment, a first part of the upper electrode 130 is directly contact with the doped silicon layer 120, and a second part of the upper electrode 130 is suspended over the doped silicon layer 120 between adjacent three-dimensional nano-structures 114. In one embodiment, the upper electrode 130 is directly coated on the doped silicon layer 120 and completely contacting with the doped silicon layer 120.

The upper electrode 130 can have good light transparency and conductivity. The upper electrode 130 can be an indium tin oxide layer or a carbon nanotube structure including a number of carbon nanotubes. The carbon nanotube structure is a freestanding structure without any supporter. The carbon nanotube structure can be at least one carbon nanotube film or at least one carbon nanotube wire. In one embodiment, the upper electrode 130 is a carbon nanotube film drawn from a carbon nanotube array.

The solar cell 10 can further include an intrinsic layer (not shown). The intrinsic layer can be located between the silicon substrate 110 and the doped silicon layer 120. The intrinsic layer can be made of silicon dioxide ($SiO_2$) or silicon nitride ($Si_3N_4$) as an insulating layer. A thickness of the intrinsic layer can range from about 1 angstrom to about 30 angstroms. The intrinsic layer can be configured to lower the speed of recombination of electron-hole pairs and further improve the photoelectric conversion efficiency of the solar cell 10.

At the interface of the silicon substrate 110 and the doped silicon layer 120, redundant electrons in the doped silicon layer 120 can move toward the silicon substrate 110, to form an inner electrical field. The inner electrical field is from the doped silicon layer 120 to the silicon substrate 110. When the sunlight irradiates the upper electrode 130, a number of electron-hole pairs can be produced by the P-N junctions. The electron-hole pairs can be separated under the inner electrical field. The electrons in the doped silicon layer 120 can move towards the upper electrode 130 and be collected by the upper electrode 130. The holes in the silicon substrate 110 can move towards the back electrode 100 and be collected by the back electrode 100. Thus an electric current can be formed through an electric circuit outside of the solar cell 10.

Figure 5:
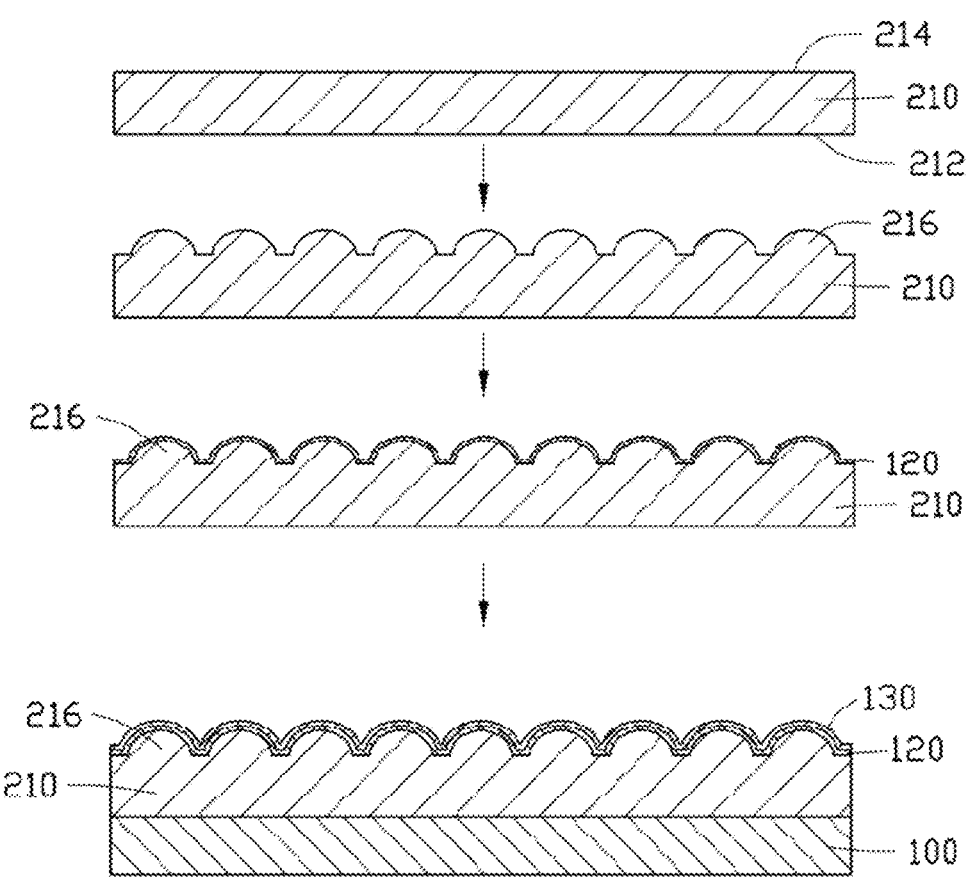
FIG. 5 shows a flowchart of one embodiment of a method for making a solar cell.

Referring to FIG. 5, one embodiment of a method for making the solar cell 10 includes the following steps:

(S10), providing a silicon plate 210 having a first silicon plate surface 212 and a second silicon plate surface 214, locating a patterned mask layer on the second silicon plate surface 214, and forming a number of three-dimensional nano-structures 216 on the second silicon plate surface 214;

(S11), forming a doped silicon layer 120 on outer surfaces of three-dimensional nano-structures 216 and the second silicon plate surface 214 that is between adjacent three-dimensional nano-structures 216;

(S12), applying the upper electrode 130 on at least part of the surface of the doped silicon layer 120; and (S13), applying the back electrode 100 Ohmic contact with the first silicon plate surface 212 of the silicon plate 210.

In step (S10), the silicon plate 210 can be a P-type semiconductor. A material of the P-type semiconductor can be single crystal silicon, multiple crystal silicon, or other P-type semiconductor materials. In one embodiment, the silicon plate 210 is a P-type single crystal silicon sheet. A thickness of the silicon plate 210 can range from about 200 micrometers to about 300 micrometers. A size and the thickness of the silicon plate 210 can be selected by application.

Figure 6:
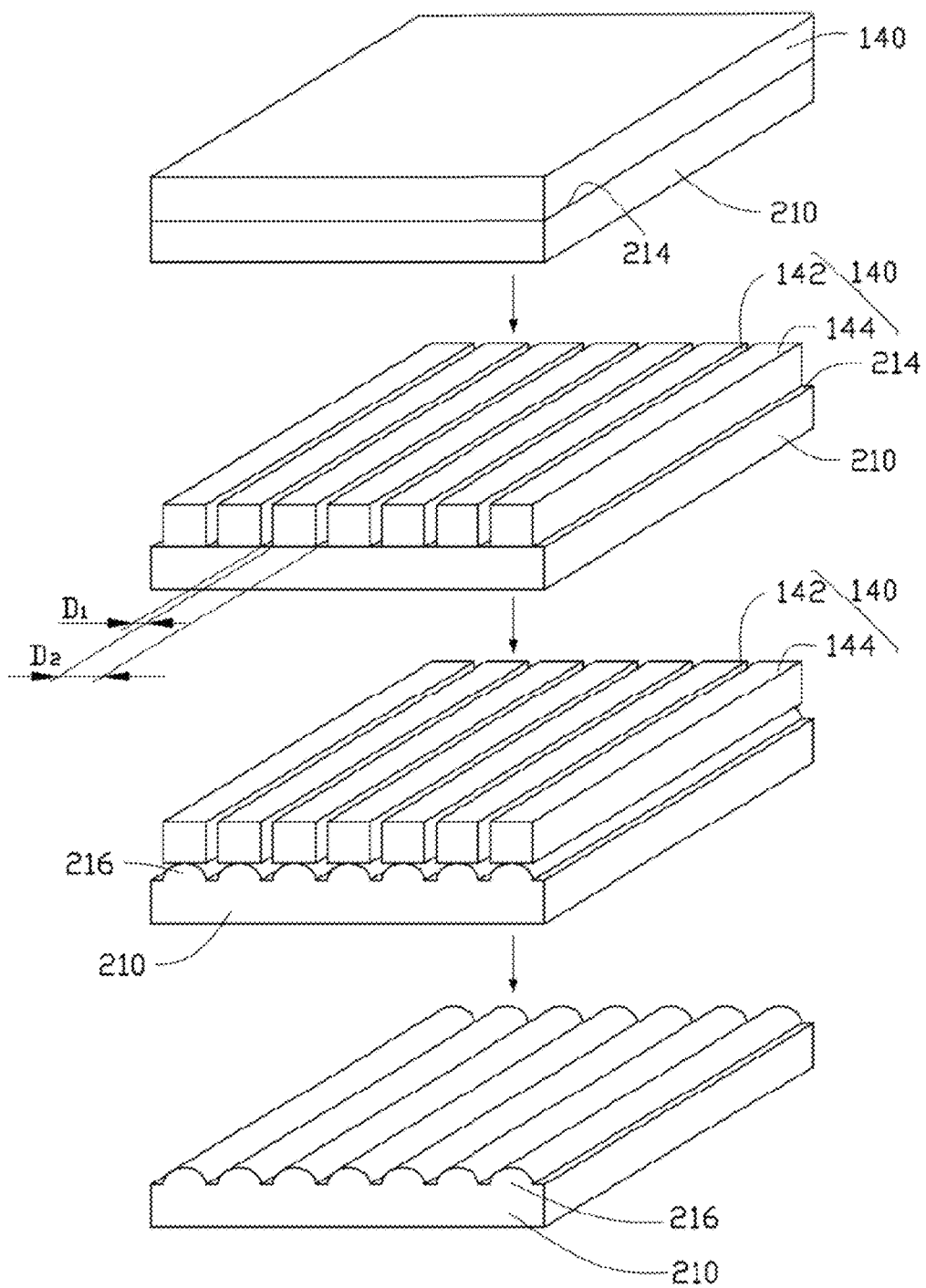
FIG. 6 shows a flowchart of one embodiment of a method for forming a silicon substrate.

Referring to FIG. 6, the step of forming the three-dimensional nano-structures 216 on the second silicon plate surface 214 can include the following sub-steps:

(S101), forming a mask layer 140 on the second silicon plate surface 214 of the silicon plate 210;

(S102), patterning the mask layer 140 by nanoimprinting method or etching method;

(S103), etching the second silicon plate surface 214 of the silicon plate 210 to form three-dimensional nano-structures 216; and (S104), removing the mask layer 140.

In step (S101), a material of the mask layer 140 can be ZEP520A, hydrogen silsesquioxane, polymethylmethacrylate, polystyrene, silicon on glass, or other silitriangle oligomers. The mask layer 140 can be used to protect the silicon plate 210 with the mask layer 140 thereon. In one embodiment, the mask layer 140 is ZEP520A.

The mask layer 140 can be formed on the second silicon plate surface 214 of the silicon plate 210 by spin coating method, slit coating method, slit and spin coating method, or dry film lamination method. In one embodiment, the mask layer 140 is formed by the following steps. First, cleaning the second silicon plate surface 214. Second, coating a layer of ZEP520A on the second silicon plate surface 214 by spin coating at a speed of about 500 rounds per minute to about 6000 rounds per minute, for about 0.5 minutes to about 1.5 minutes. Third, drying the silicon plate 210 with the layer of ZEP520A thereon at a temperature of about 140 degrees centigrade to 180 degrees centigrade, for about 3 minutes to about 5 minutes, thereby forming the mask layer 140 on the second silicon plate surface 214. A thickness of the mask layer 140 can be in a range of about 100 nanometers to about 500 nanometers.

In step (S102), the mask layer 140 can be patterned by electron beam lithography method, photolithography method, or nanoimprint lithography method. In one embodiment, the mask layer 140 is patterned by electron beam lithography. During the patterning process, a number of grooves 142 can be formed in the mask layer 140 to expose the second silicon plate surface 214 of the silicon plate 210. The grooves 142 can be uniformly distributed in the mask layer 140 and spaced from each other. The mask layer 140, between each adjacent two grooves 142, forms a linear wall 144.

A distribution of the linear walls 144 can be the same as a distribution of the three-dimensional nano-structures 114. The linear walls 144 can be uniformly distributed in the mask layer 140 to an array. The linear walls 144 in the array can be substantially equidistantly arranged, concentric circularly arranged, or concentric rectangle arranged. The linear wall 144 can arrange along a straight line, a curvy line, or a polygonal line. A width of the linear walls 144 can be equal to the width $D_2$ of the linear protruding structures. The width of the linear walls 144 can range from about 200 nanometers to about 1000 nanometers. In some embodiments, the width of the linear walls 144 ranges from about 300 nanometers to about 400 nanometers. A distance between adjacent linear walls 144 can be equal to the distance $D_1$ between adjacent linear protruding structures. The distance between adjacent linear walls 144 can range from about 10 nanometers to about 1000 nanometers. In some embodiments, the distance between adjacent linear walls 144 ranges from about 100 nanometers to about 200 nanometers. In one embodiment, the linear walls 144 are substantially equidistantly arranged and extend along a same direction; the distance between adjacent linear walls 144 is about 140 nanometers; and the width of the linear walls 144 is about 320 nanometers.

In step (S103), the process of etching the second silicon plate surface 214 of the silicon plate 210 can be carried out in a microwave plasma system at reaction-ion-etching mode. The microwave plasma system can produce a reactive atmosphere 150. A material of the reactive atmosphere 150 can be chosen according to the material of the silicon plate 210 and the material of the mask layer 140. The reactive atmosphere 150 with lower ions energy can diffuse to the second silicon plate surface 214 of the silicon plate 210 between adjacent linear walls 144 to etch the second silicon plate surface 214 of the silicon plate 210.

Figure 7:
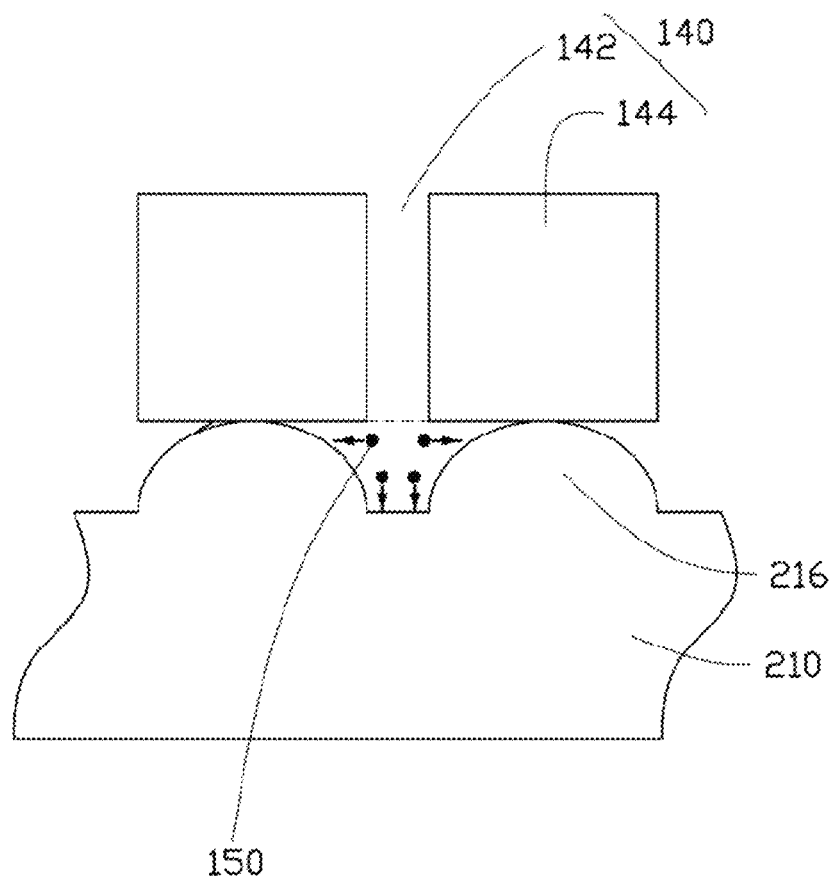
FIG. 7 shows a process of one embodiment of a method for forming a number of three-dimensional nano-structures on a silicon plate.

Referring to FIG. 7, for one hand, the reactive atmosphere 150 can etch the silicon plate 210 exposed by the grooves 142 along a first etch direction. The first etch direction is substantially perpendicular to the second silicon plate surface 214. For the other hand, two sidewalls of the silicon plate 210 covered by the linear walls 144 can be formed gradually as the silicon plate 210 is etched along the first etch direction. Thus, the reactive atmosphere 150 can etch the two sidewalls of the silicon plate 210 covered by the linear walls 144 along a second etch direction. The second etch direction can be substantially paralleled to the second silicon plate surface 214 of the silicon plate 210. Therefore, the three-dimensional nano-structures 216 can be formed. The three-dimensional nano-structures 216 can be the same with the three-dimensional nano-structures 114.

In one embodiment, the reactive atmosphere 150 consists of chlorine gas and argon gas. An input flow rate of the chlorine gas can be lower than an input flow rate of the argon gas. The input flow rate of the chlorine gas can be in a range from about 4 standard-state cubic centimeters per minute to about 20 standard-state cubic centimeters per minute. The input flow rate of the argon gas can be in a range from about 10 standard-state cubic centimeters per minute to about 60 standard-state cubic centimeters per minute. A power of the plasma system can be in a range from about 40 Watts to about 70 Watts. A working pressure of the reactive atmosphere 150 can be a range from about 2 Pa to about 10 Pa. An etching time of the reactive atmosphere 150 can be in a range from about 1 minute to about 2.5 minutes. In one embodiment, the input flow rate of the chlorine gas is about 10 standard-state cubic centimeters per minute; the input flow rate of the argon gas is about 25 standard-state cubic centimeters per minute; the power of the plasma system is about 70 Watts; the working pressure of the reactive atmosphere 150 is about 2; and the etching time of the reactive atmosphere 150 is about 2 minutes.

In step (S104), the three-dimensional nano-structures 216 can be obtained by dissolving the mask layer 140. The mask layer 140 can be removed by dissolving it in a stripping agent such as tetrahydrofuran, acetone, butanone, cyclohexane, hexane, methanol, or ethanol. In one embodiment, the stripping agent is acetone, and the mask layer 140 is dissolved in acetone and separated from the silicon plate 210. The mask layer 140 is removed to form the silicon substrate 110.

In step (S12), the doped silicon layer 120 can be formed by injecting superfluous N-type doped material, such as phosphorus or arsenic, into the outer surface of the three-dimensional nano-structures 216 and the second silicon plate surface 214 that is between adjacent three-dimensional nano-structures 216. The doped silicon layer 120 can also be formed by coating an N-type semiconductor material on the outer surface of the three-dimensional nano-structures 216 and the second silicon plate surface 214 that is between adjacent three-dimensional nano-structures 216. A thickness of the doped silicon layer 120 can range from about 10 nanometers to about 1 micrometer. In one embodiment, the step (S12) further includes a step of applying an intrinsic layer on the outer surface of the three-dimensional nano-structures 216 and the second silicon plate surface 214 that is between adjacent three-dimensional nano-structures 216, before forming the doped silicon layer 120. The intrinsic layer can act as an insulating layer and be made of $SiO_2$ or $Si_3N_4$. A thickness of the intrinsic layer can range from about 1 angstrom to about 30 angstroms.

The method for fabricating the solar cell 10 has the following advantages. First, by controlling the input flow rates of the chlorine gas and the argon gas, the reactive atmosphere can etch the silicon plate along two different etch directions, thus, the plurality of arc three-dimensional structures can be easily formed on the silicon plate. Second, the method can be carried out at room temperature, thus, the method is simple and low cost. Third, an area of the solar cell 10 for extracting sunlight can be increased, thus, the productivity of the solar cell can be improved.

Figure 8:
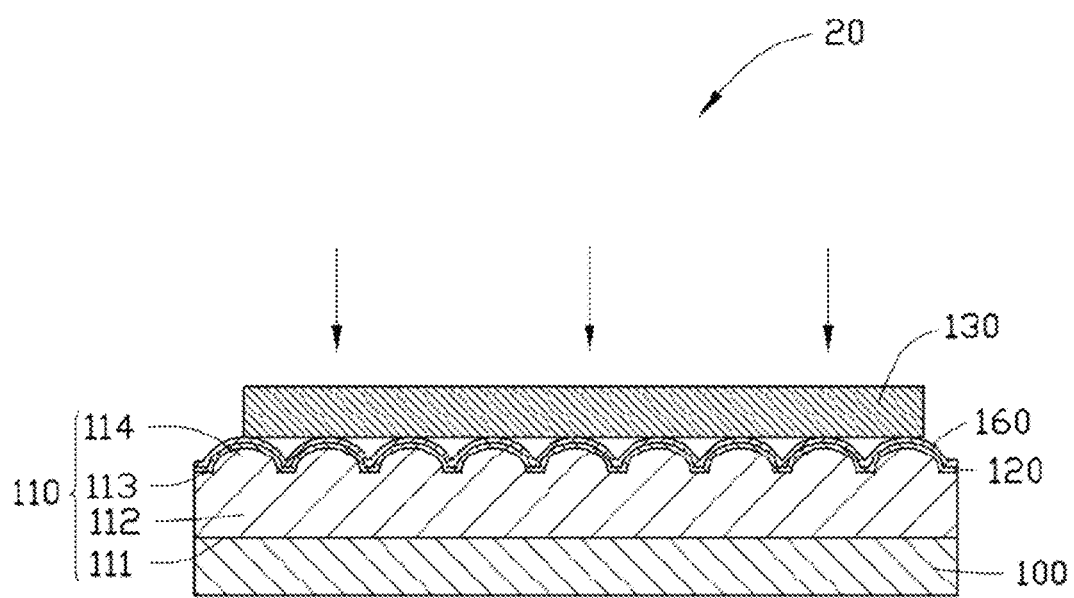
FIG. 8 is a schematic view of another embodiment of a solar cell.

Referring to FIG. 8, another embodiment of a solar cell 20 is provided. The solar cell 20 further includes a metal layer 160 attached on an outer surface of the doped silicon layer 120. Other characteristics of the solar cell 20 are the same as the solar cell 10. The metal layer 160 can be a single layer sheet-structure or a multi-layer sheet-structure. The metal layer 160 is formed by a number of nano-scaled metal particles spread out on the doped silicon layer 120. A thickness of the metal layer 160 can range from about 2 nanometers to about 200 nanometers. A material of the metal layer 160 can be gold, silver, copper, iron or aluminum. In one embodiment, the metal layer 160 can be a nano-gold layer with a thickness of about 50 nanometers.

The upper electrode 130 can partially contact with the metal layer 160 or completely contact with the metal layer 160. In one embodiment, the upper electrode 130 is in partially contact with the metal layer 160 and is suspended over the metal layer 160 between adjacent three-dimensional nano-structures 114.

When the sunlight goes through the upper electrode 130 and irradiates the metal layer 160, a surface of the metal layer 160 can be excited to form a number of plasmas. Therefore, the photon absorption of the doped silicon layer 120 adjacent to the metal layer 160 can be improved. In addition, an electromagnetic field produced by the plasmas on the surface of the metal layer 160 can be used to separate the electron-hole pairs produced in the P-N junctions under the sunlight.

In yet another embodiment, a method for making the solar cell 20 comprises a step of coating the metal layer 160 on the outer surface of the doped silicon layer 120 is further provided, after the doped silicon layer 120 is formed. In one embodiment, the metal layer 160 is formed on the outer surface of the doped silicon layer 120 by an electron beam evaporation method.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for making a solar cell comprising steps of:
providing a silicon plate having a first surface and a second surface;
locating a patterned mask layer on the second surface, wherein the patterned mask layer comprises a plurality of linear walls aligned side by side, and a groove is defined between each adjacent two linear walls to expose an exposed portion of the second surface of the silicon plate;
forming a plurality of three-dimensional structures by etching the exposed portion of the second surface of the silicon plate along a first etching direction and a second etching direction, the first etching direction is perpendicular to the second surface, the second etching direction is parallel to the second surface; and each of the plurality of three-dimensional structures is a linear protruding structure having a length direction parallel to the second surface, and a cross-section of each linear protruding structure along a direction perpendicular to the length direction and the second surface is an arc;
removing the patterned mask layer and forming a doped silicon layer on surfaces of the plurality of three-dimensional structures and the second surface that is between adjacent three-dimensional structures;
applying an upper electrode electrically connected to the doped silicon layer; and
applying a back electrode Ohmic connected to the silicon plate.

2. The method of claim 1, wherein the plurality of linear walls is uniformly distributed in the patterned mask layer to form an array.

3. The method of claim 2, wherein the plurality of linear walls in the array is substantially equidistantly arranged, concentric circularly arranged, or concentric rectangle arranged.

4. The method of claim 1, wherein the plurality of linear walls is arranged along a straight line, a curvy line, or a polygonal line.

5. The method of claim 1, wherein a width of the plurality of linear walls range from about 300 nanometers to about 400 nanometers.

6. The method of claim 1, wherein a distance between adjacent linear walls ranges from about 100 nanometers to about 200 nanometers.

7. The method of claim 1, wherein the step of locating the patterned mask layer on the second surface comprises the sub-steps of:
forming a mask layer on the second surface of the silicon plate by spin coating, slit coating, slit and spin coating, or dry film lamination; and
forming a plurality of grooves in the mask layer to expose the portion of the second surface of the silicon plate by electron beam lithography method, photolithography method, or nanoimprint lithography method, thus forming the patterned mask layer.

8. The method of claim 1, wherein the step of etching the exposed portion of the second surface of the silicon plate is carried out in a microwave plasma system.

9. The method of claim 8, wherein the microwave plasma system is capable of producing a reactive atmosphere.

10. The method of claim 9, wherein the reactive atmosphere comprises chlorine gas and argon gas.

11. The method of claim 10, wherein a chlorine gas input flow rate is lower than an argon gas input flow rate.

12. The method of claim 11, wherein the chlorine gas input flow rate is in a range from about 4 standard-state cubic centimeters per minute to about 20 standard-state cubic centimeters per minute.

13. The method of claim 11, wherein the argon gas input flow rate is in a range from about 10 standard-state cubic centimeters per minute to about 60 standard-state cubic centimeters per minute.

14. The method of claim 1, wherein the patterned mask layer remains during the step of etching the exposed portion.

15. A method for making a solar cell comprising steps of:
providing a silicon plate having a first surface and a second surface;
locating a patterned mask layer on the second surface, wherein the patterned mask layer comprises a plurality of linear walls aligned side by side, and a groove is defined between each adjacent two linear walls to expose an exposed portion of the second surface of the silicon plate;
forming a plurality of three-dimensional structures by etching the exposed portion of the second surface of the silicon plate along a first etching direction to form two sidewalls in the silicon plate covered by the plurality of linear walls, and etching the two sidewalls along a second etching direction perpendicular to the first etching direction; each of the plurality of three-dimensional structures is a linear protruding structure having a length direction parallel to the second surface, and a cross-section of each linear protruding structure along a direction perpendicular to the length direction and the second surface is an arc;
removing the patterned mask layer and forming a doped silicon layer on surfaces of the plurality of three-dimensional structures and the second surface that is between adjacent three-dimensional structures;
applying an upper electrode electrically connected to the doped silicon layer; and
applying a back electrode Ohmic connected to the silicon plate.

16. The method of claim 15, wherein the first etching direction is perpendicular to the second surface of the silicon plate, the second etching direction is paralleled to second surface of the silicon plate.

17. The method of claim 15, wherein the step of etching the exposed portion of the second surface of the silicon plate is carried out in a microwave plasma system capable of producing a reactive atmosphere.

18. The method of claim 17, wherein a power of the microwave plasma system ranges from about 40 Watts to about 70 Watts, a working pressure of the reactive atmosphere ranges from about 2 Pa to about 10 Pa.

19. The method of claim 17, wherein the reactive atmosphere comprises chlorine gas and argon gas, and a chlorine gas input flow rate is lower than an argon gas input flow rate.

20. A method for making a solar cell comprising steps of:
providing a silicon plate having a first surface and a second surface;
locating a patterned mask layer on the second surface, wherein the patterned mask layer comprises a plurality of linear walls aligned side by side, and a groove is defined between each adjacent two linear walls to expose an exposed portion of the second surface of the silicon plate;
forming a plurality of three-dimensional structures by etching the exposed portion of the second surface of the silicon plate along a first etching direction and a second etching direction perpendicular to the first etching direction, the patterned mask layer remains during the step of etching the exposed portion; wherein each of the plurality of three-dimensional structures is a linear protruding structure having a length direction parallel to the second surface, and a cross-section of each linear protruding structure along a direction perpendicular to the length direction and the second surface is an arc;
removing the patterned mask layer and forming a doped silicon layer on surfaces of the plurality of three-dimensional structures and the second surface that is between adjacent three-dimensional structures;
applying an upper electrode electrically connected to the doped silicon layer; and
applying a back electrode Ohmic connected to the silicon plate.

* * * * *